US011228697B2

(12) United States Patent
Mleczko et al.

(10) Patent No.: US 11,228,697 B2
(45) **Date of Patent: *Jan. 18, 2022**

(54) VEHICULAR CAMERA WITH ENHANCED HEAT DISSIPATION

(71) Applicant: Magna Electronics Inc., Auburn Hills, MI (US)

(72) Inventors: Jamie A. Mleczko, Washington, MI (US); Steven V. Byrne, Goodrich, MI (US); Jonathan D. Conger, Berkley, MI (US); Rene Dreiocker, Rochester Hills, MI (US); Rainer Strey, Solms (DE)

(73) Assignee: MAGNA ELECTRONICS INC., Auburn Hills, MI (US)

(*) Notice: Subject to any disclaimer, the term of this patent is extended or adjusted under 35 U.S.C. 154(b) by 0 days.

This patent is subject to a terminal disclaimer.

(21) Appl. No.: 17/247,081

(22) Filed: Nov. 30, 2020

(65) Prior Publication Data

US 2021/0084208 A1 Mar. 18, 2021

Related U.S. Application Data

(63) Continuation of application No. 16/165,204, filed on Oct. 19, 2018, now Pat. No. 10,855,890.

(Continued)

(51) Int. Cl.
*H04N 5/225* (2006.01)
*B60R 1/00* (2006.01)
(Continued)

(52) U.S. Cl.
CPC .......... *H04N 5/22521* (2018.08); *B60R 1/00* (2013.01); *B60R 11/04* (2013.01); *F25B 21/02* (2013.01);
(Continued)

(58) Field of Classification Search
CPC ............ H04N 5/22521; H04N 5/2253; H04N 5/2252; B60R 11/04; B60R 1/00;
(Continued)

(56) References Cited

U.S. PATENT DOCUMENTS 4,712,879 A 12/1987 Lynam et al.
5,393,931 A 2/1995 Guenther
(Continued)

*Primary Examiner* — Jason A Flohre
(74) *Attorney, Agent, or Firm* — Honigman LLP

(57) ABSTRACT

A vehicular camera module includes a lens barrel having a plurality of optical elements accommodated therein, a front camera housing portion, and a rear camera housing portion mated with the front camera housing to form a housing that encases an imager printed circuit board and a processor printed circuit board. A heat transfer element is disposed between and in thermal conductive contact with the imager printed circuit board and a rear wall of the rear camera housing. The heat transfer element extends through an aperture of the processor printed circuit board. Circuitry of the camera module is electrically connected to electrical connecting elements that electrically connect to a wire harness of a vehicle when the camera module is disposed at the vehicle. Heat generated by operation of the vehicular camera module is drawn from the imager printed circuit board to the rear camera housing portion via the heat transfer element.

20 Claims, 2 Drawing Sheets

Related U.S. Application Data

(60) Provisional application No. 62/575,651, filed on Oct. 23, 2017.

(51) Int. Cl.
*H05K 7/20* (2006.01)
*F25B 21/02* (2006.01)
*B60R 11/04* (2006.01)

(52) U.S. Cl.
CPC ......... *H04N 5/2252* (2013.01); *H04N 5/2253* (2013.01); *H05K 7/205* (2013.01); *H05K 7/20409* (2013.01); *H05K 7/20854* (2013.01); *B60R 2300/105* (2013.01); *B60R 2300/30* (2013.01); *F25B 2321/023* (2013.01); *F25B 2321/0251* (2013.01)

(58) Field of Classification Search
CPC .......... B60R 2300/30; B60R 2300/105; H05K 7/20854; H05K 7/205; H05K 7/20409; F25B 2321/0251; F25B 21/02; F25B 2321/023
See application file for complete search history.

(56) References Cited

U.S. PATENT DOCUMENTS

| | | | |
|---|---|---|---|
| 5,550,677 | A | 8/1996 | Schofield et al. |
| 5,670,935 | A | 9/1997 | Schofield et al. |
| 5,949,331 | A | 9/1999 | Schofield et al. |
| 5,978,017 | A | 11/1999 | Tino |
| 6,151,065 | A | 11/2000 | Steed et al. |
| 6,690,268 | B2 | 2/2004 | Schofield et al. |
| 6,824,281 | B2 | 11/2004 | Schofield et al. |
| 7,038,577 | B2 | 5/2006 | Pawlicki et al. |
| 7,479,986 | B2 | 1/2009 | Karaki |
| 7,480,149 | B2 | 1/2009 | DeWard et al. |
| 7,720,580 | B2 | 5/2010 | Higgins-Luthman |
| 7,855,755 | B2 | 12/2010 | Weller et al. |
| 7,965,336 | B2 | 6/2011 | Bingle et al. |
| 8,256,821 | B2 | 9/2012 | Lawlor et al. |
| 8,542,451 | B2 | 9/2013 | Lu et al. |
| 8,994,878 | B2 | 3/2015 | Byrne et al. |
| 9,077,098 | B2 | 7/2015 | Latunski |
| 9,233,641 | B2 | 1/2016 | Sesti et al. |
| 9,277,104 | B2 | 3/2016 | Sesti et al. |
| 9,596,387 | B2 | 3/2017 | Achenbach et al. |
| 9,621,769 | B2 | 4/2017 | Mai et al. |
| 10,207,646 | B2 | 2/2019 | Oh |
| 10,274,812 | B1 | 4/2019 | Chen |
| 10,855,890 | B2 | 12/2020 | Mleczko et al. |
| 2003/0090569 | A1 | 5/2003 | Poechmueller |
| 2004/0169771 | A1 | 9/2004 | Washington et al. |
| 2009/0244361 | A1 | 10/2009 | Gebauer et al. |
| 2009/0295181 | A1 | 12/2009 | Lawlor et al. |
| 2011/0025850 | A1 | 2/2011 | Maekawa et al. |
| 2011/0298925 | A1 | 12/2011 | Inoue et al. |
| 2013/0242099 | A1 | 9/2013 | Sauer et al. |
| 2014/0104184 | A1 | 4/2014 | Meador et al. |
| 2014/0160284 | A1 | 6/2014 | Achenbach et al. |
| 2014/0226012 | A1 | 8/2014 | Achenbach |
| 2014/0373345 | A1 | 12/2014 | Steigerwald |
| 2015/0015713 | A1 | 1/2015 | Wang et al. |
| 2015/0029337 | A1 | 1/2015 | Uchiyama et al. |
| 2015/0054961 | A1 | 2/2015 | Saitoh et al. |
| 2015/0070557 | A1 | 3/2015 | Petty et al. |
| 2015/0124098 | A1 | 5/2015 | Winden et al. |
| 2015/0205186 | A1 | 7/2015 | Park et al. |
| 2015/0222795 | A1 | 8/2015 | Sauer et al. |
| 2015/0266430 | A1 | 9/2015 | Mleczko et al. |
| 2015/0327398 | A1 | 11/2015 | Achenbach et al. |
| 2015/0365569 | A1 | 12/2015 | Mai et al. |
| 2016/0037028 | A1 | 2/2016 | Biemer |
| 2016/0191863 | A1 | 6/2016 | Minikey, Jr. et al. |
| 2016/0243987 | A1 | 8/2016 | Kendall |
| 2016/0268716 | A1 | 9/2016 | Conger et al. |
| 2016/0286103 | A1 | 9/2016 | Van Dan Elzen |
| 2017/0036600 | A1 | 2/2017 | Whitehead et al. |
| 2017/0054881 | A1 | 2/2017 | Conger et al. |
| 2017/0133811 | A1 | 5/2017 | Conger et al. |
| 2017/0201661 | A1 | 7/2017 | Conger |
| 2017/0280034 | A1 | 9/2017 | Hess et al. |
| 2017/0295306 | A1 | 10/2017 | Mleczko |
| 2017/0302829 | A1 | 10/2017 | Mleczko et al. |
| 2018/0027151 | A1 | 1/2018 | Kazama et al. |
| 2018/0072239 | A1 | 3/2018 | Wienecke et al. |
| 2018/0098033 | A1 | 4/2018 | Mleczko et al. |
| 2018/0241917 | A1 | 8/2018 | Zhang et al. |
| 2019/0121051 | A1 | 4/2019 | Byrne et al. |
| 2019/0124238 | A1 | 4/2019 | Byrne et al. |
| 2019/0124243 | A1 | 4/2019 | Mleczko et al. |
| 2019/0306966 | A1 | 10/2019 | Byrne et al. |
| 2020/0001787 | A1 | 1/2020 | Lu et al. |
| 2020/0010024 | A1 | 1/2020 | Sesti et al. |

VEHICULAR CAMERA WITH ENHANCED HEAT DISSIPATION

CROSS REFERENCE TO RELATED APPLICATIONS

The present application is a continuation of U.S. patent application Ser. No. 16/165,204, filed Oct. 19, 2018, now U.S. Pat. No. 10,855,890, which claims the filing benefits of U.S. provisional application Ser. No. 62/575,651, filed Oct. 23, 2017, which is hereby incorporated herein by reference in its entirety.

FIELD OF THE INVENTION

The present invention relates generally to a vehicle vision system for a vehicle and, more particularly, to a vehicle vision system that utilizes one or more cameras at a vehicle.

BACKGROUND OF THE INVENTION

Use of imaging sensors in vehicle imaging systems is common and known. Examples of such known systems are described in U.S. Pat. Nos. 5,949,331; 5,670,935 and/or 5,550,677, which are hereby incorporated herein by reference in their entireties. Various cameras have been proposed for such imaging systems, including cameras of the types described in U.S. Pat. No. 7,965,336 and U.S. Publication No. US-2009-0244361, which are hereby incorporated herein by reference in their entireties.

SUMMARY OF THE INVENTION

The present invention provides a vision system or imaging system for a vehicle that utilizes one or more cameras to capture image data representative of images exterior of the vehicle. The camera or camera module comprises an imager and a circuit board (or circuit boards) and a lens at a lens barrel. A front camera housing portion is configured to receive an imager printed circuit board therein, with the imager printed circuit board disposed at the lens barrel with the imager optically aligned with an optical axis of optical elements of the lens. A rear camera housing portion is mated with a rear portion of the front camera housing so as to encase and seal the imager printed circuit board in the camera module. A thermoelectric device is disposed at the rear camera housing portion, and a heat transfer element is disposed between and in thermal conductive contact with the thermoelectric device and the imager printed circuit board. The thermoelectric device is electrically powered to draw heat from the imager printed circuit board to the rear camera housing portion. The thermoelectric device may be operable responsive to a temperature sensor disposed in the camera module. Circuitry of the camera module is electrically connected to the imager and the thermoelectric device and is electrically connected to electrical connecting elements that are configured to electrically connect to a wire harness of the vehicle.

These and other objects, advantages, purposes and features of the present invention will become apparent upon review of the following specification in conjunction with the drawings.

DESCRIPTION OF THE PREFERRED EMBODIMENTS

A vehicle vision system and/or driver assist system and/or object detection system and/or alert system operates to capture images exterior of the vehicle and may process the captured image data to display images and to detect objects at or near the vehicle and in the predicted path of the vehicle, such as to assist a driver of the vehicle in maneuvering the vehicle in a rearward direction. The vision system includes an image processor or image processing system that is operable to receive image data from one or more cameras and provide an output to a display device for displaying images representative of the captured image data. Optionally, the vision system may provide display, such as a rearview display or a top down or bird's eye or surround view display or the like.

Figure 1:
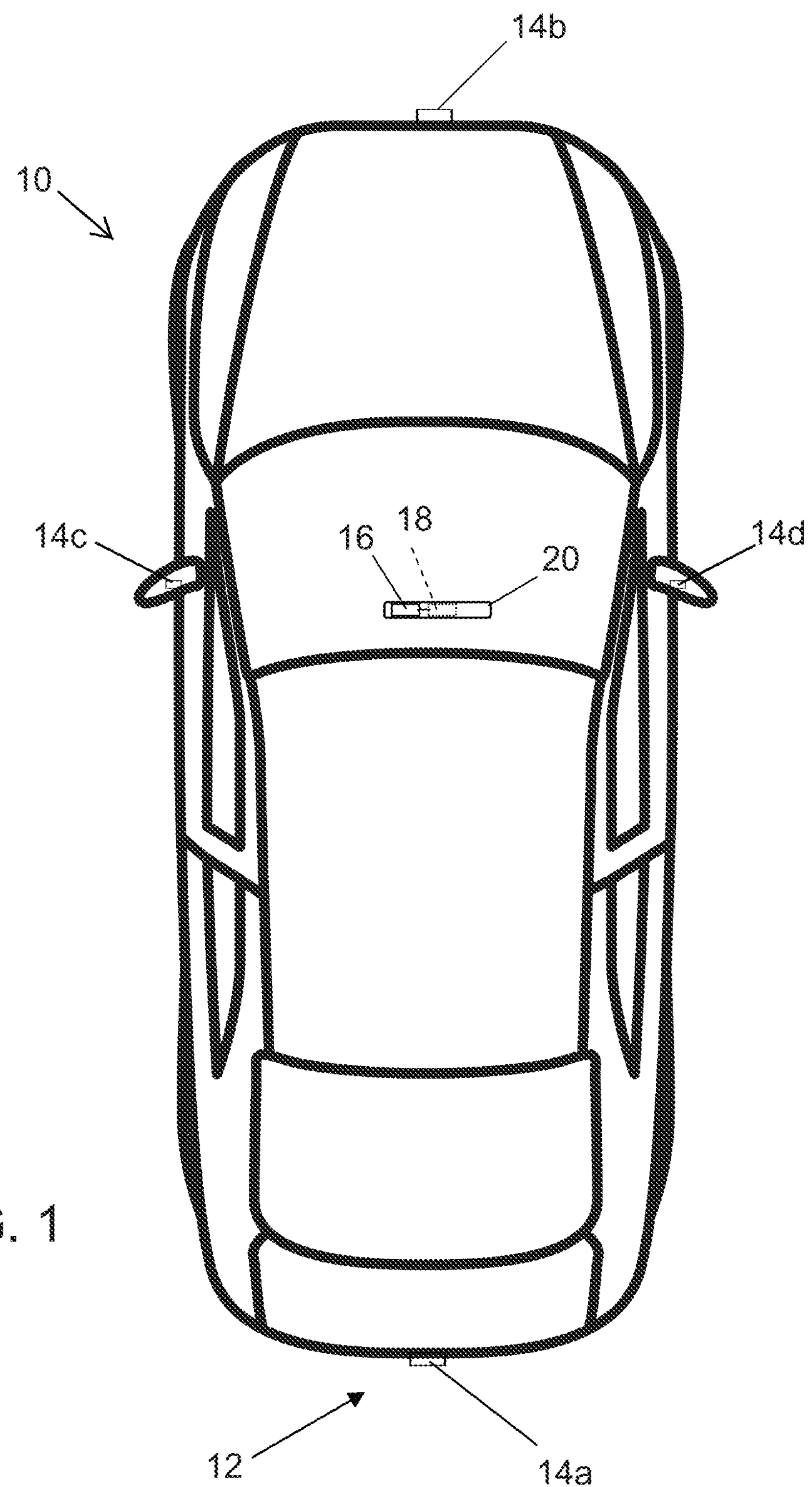
FIG. 1 is a plan view of a vehicle with a vision system that incorporates cameras in accordance with the present invention.

Referring now to the drawings and the illustrative embodiments depicted therein, a vehicle 10 includes an imaging system or vision system 12 that includes at least one exterior facing imaging sensor or camera, such as a rearward facing imaging sensor or camera 14*a* (and the system may optionally include multiple exterior facing imaging sensors or cameras, such as a forward facing camera 14*b* at the front (or at the windshield) of the vehicle, and a sideward/rearward facing camera 14*c*, 14*d* at respective sides of the vehicle), which captures images exterior of the vehicle, with the camera having a lens for focusing images at or onto an imaging array or imaging plane or imager of the camera (FIG. 1). Optionally, a forward viewing camera may be disposed at the windshield of the vehicle and view through the windshield and forward of the vehicle, such as for a machine vision system (such as for traffic sign recognition, headlamp control, pedestrian detection, collision avoidance, lane marker detection and/or the like). The vision system 12 includes a control or electronic control unit (ECU) or processor 18 that is operable to process image data captured by the camera or cameras and may detect objects or the like and/or provide displayed images at a display device 16 for viewing by the driver of the vehicle (although shown in FIG. 1 as being part of or incorporated in or at an interior rearview mirror assembly 20 of the vehicle, the control and/or the display device may be disposed elsewhere at or in the vehicle). The data transfer or signal communication from the camera to the ECU may comprise any suitable data or communication link, such as a vehicle network bus or the like of the equipped vehicle.

The control unit may comprise or may be part of an autonomous vehicle control system, whereby the cameras capture image data that is processed for use in autonomously controlling the vehicle. Such high resolution autonomous vehicle cameras require exceptional image quality for machine vision. Image quality degradation occurs from sensor noise at elevated temperatures. Automotive industry sensor suppliers see this occurring to some degree at temperatures as low as 45 degrees C.

High-resolution and automotive cameras take steps to optimize heat transfer between the image sensor or imager and external heat dissipating features. Many such cameras are expected to operate in ambient temperatures as high as around 85 degrees C. so can rarely achieve sensor junction temperatures below around 100 degrees C. Image degradation at these temperatures may be substantial and limits machine vision capabilities.

Figure 2:
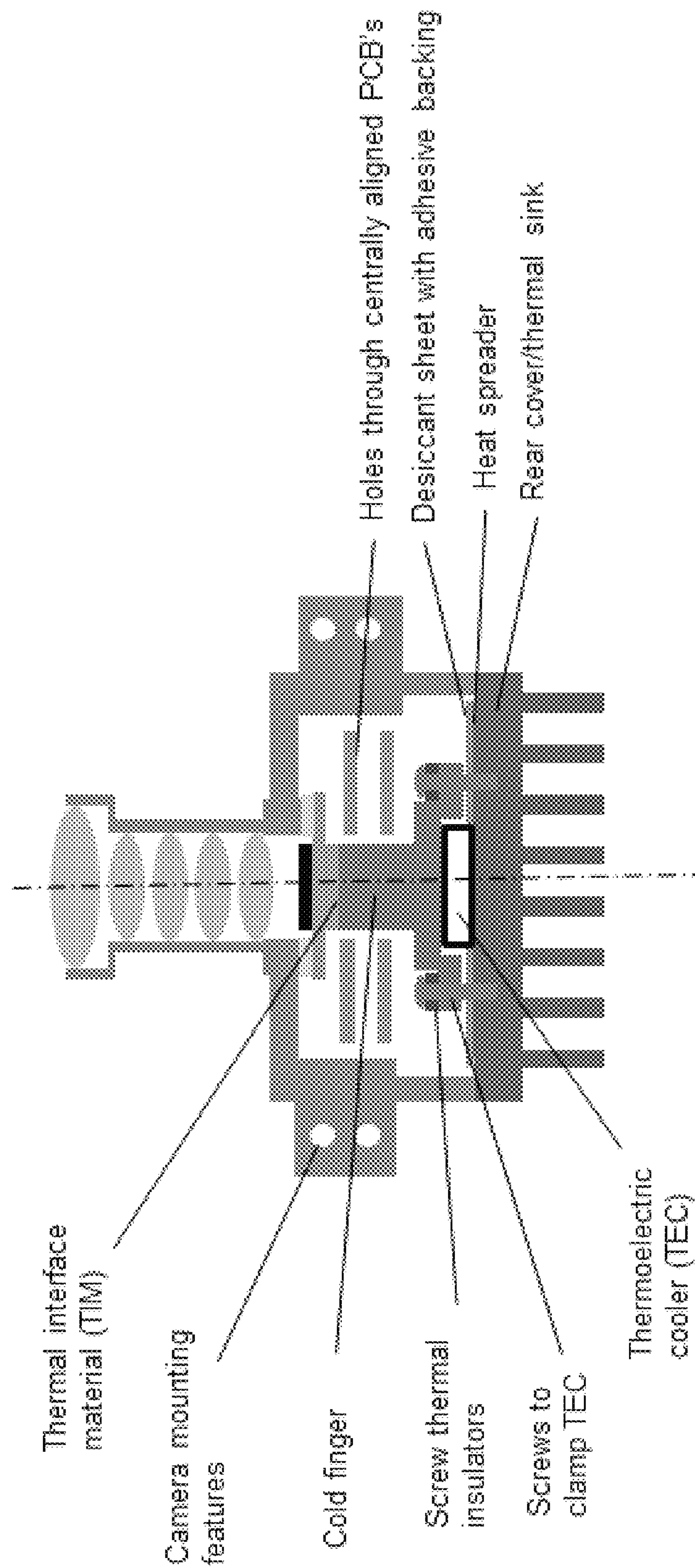
FIG. 2 is a sectional view of a camera module in accordance with the present invention.

The autonomous vehicle camera of the present invention includes active cooling. As shown in FIG. 2, a thermoelectric cooler (TEC), or Peltier element, is used to substantially cool the image sensor to a desired temperature. The camera thus comprises the first automotive camera with an actively cooled image sensor. The camera includes temperature sensors within the camera that are used to control power to the TEC as needed for cooling effect. For example, responsive to the sensed temperature being above a threshold level, power to the TEC may be provided or increased or modulated or controlled to provide more cooling. The system may continuously or episodically sense or monitor the camera temperature and may continuously or episodically adjust the power supplied to the TEC to provide the desired cooling effect. The sensor and control for sensing temperature and controlling or powering the TEC may be part of the camera module itself, such as part of the circuitry disposed on one or more circuit boards in the camera module.

As also shown in FIG. 2, the rear cover of the camera will be used as a "heat sink" and can have cooling fins or pins. The TEC is disposed or captured between the rear cover or rear housing portion and a copper or aluminum "cold finger" or element that directs or transfers the heat from the image sensor to the TEC. Optionally, for space efficiency, a centralized heat removal system (the cold finger in FIG. 2) may extend through holes in additional PCBs to provide the heat transfer path centrally from the image sensor to the TEC at the rear housing portion.

Thus, and such as shown in FIG. 2, the camera module of the present invention includes a lens barrel and camera upper or front housing portion, with the imager disposed at or near the lens barrel and focused and aligned with the optical elements of the lens barrel. The rear housing portion includes an electrically powered thermoelectric cooler that is in contact with a heat transfer element or cold finger that extends from the TEC to the imager circuit board. Optionally, a thermal interface material may be disposed between the imager circuit board and the heat transfer element to enhance heat transfer from the rear of the imager circuit board to the heat transfer element. The thermal interface material may comprise any suitable thermally conductive material, such as, for example, thermally conductive paste, epoxy, film or tape or the like, which establishes a thermally conductive connection between the end of the heat transfer element and the printed circuit board.

The heat transfer element is formed to be disposed over and at least partially around the TEC and is attached to the rear housing portion via fasteners or screws, which may be tightened to clamp the heat transfer element to and around the TEC to provide and maintain contact between the heat transfer element and the TEC. Thermal insulators may be provided at the screws. Optionally, for example, a desiccant sheet with adhesive backing may be disposed between the heat transfer element and the rear housing portion. Optionally, a heat spreader, such as one made from graphite (such as a graphite sheet or layer or film, or such as another suitable heat spreading or heat diffusing sheet or layer or film, such as, for example, a graphene sheet or layer or film or the like), may be disposed between the heat transfer element and the rear housing portion to enhance the rear cover sink ability.

In the illustrated embodiment, the camera module includes two printed circuit boards (in addition to the imager PCB) that include circuitry associated with the imager and camera. The heat transfer element protrudes generally centrally aligned holes or apertures in the two PCBs and terminates at the rear of the imager PCB, such that the heat transfer element thermally conductively connects at the rear of the imager PCB to draw or conduct or transfer heat generated by the imager (during operation of the camera) away from the imager PCB to the TEC and rear cover or housing portion. Optionally, the heat transfer element may contact one or both of the other PCBs to draw heat from them as well. Optionally, the heat transfer element may engage a rear side of another circuit board (and not engage the imager PCB) to draw heat from circuitry or components that are disposed on the other circuit board (such that heat generated by an image processor of the other circuit board is drawn away from the image processor and toward the rear of the camera). Circuitry of the PCBs and of the camera module (including the image processor and TEC or circuitry associated with the TEC) is electrically connected to the imager and is electrically connected to electrical connecting elements that are configured to electrically connect to a wire harness of the vehicle when the camera module is disposed at the vehicle.

As shown in FIG. 2, the heat transfer element is in thermal conductive contact with the TEC and with the rear housing or cover and the heat sink, and extends therefrom into the cavity of the camera module. The end of the heat transfer element that is distal from the TEC and the rear housing is in thermal contact with the imager PCB (at the rear or opposite side of the imager PCB from where the imager is disposed). The heat transfer element protrudes through an aperture or hole through one or more other PCBs, which are centrally aligned with the axis of the camera module and lens assembly. The desiccant sheet and/or heat spreader may be disposed at the interior surface of the rear housing portion and between the rear housing portion and the heat transfer element (which may be fastened to the rear housing portion via fasteners or the like) to spread the heat conducted by the heat transfer element (drawn from the PCB(s) via operation of the TEC) over the rear housing portion and heat sink to enhance cooling of the camera module during operation.

Also, the image sensor PCB is directly adhesively bonded at the front camera housing or lens or lens barrel. To eliminate all sources of movement between the lens and image sensor, the imager or its printed circuit board is bonded directly to the lens structure or lens barrel, such as via a suitable quick-cure adhesive (see FIG. 2). The bonding adhesive also acts as the pliable assembly element or member between the optics and the imager or imaging sensor for the focus and alignment steps (and then cures to a cured state that retains the imager PCB and imager relative to the lens barrel and lens). For example, the adhesive and focus and alignment steps may utilize aspects of the cameras and processes described in U.S. Pat. Nos. 8,542,451 and 9,277,104, which are hereby incorporated herein by reference in their entireties.

The camera module may utilize aspects of the cameras and connectors described in U.S. Pat. Nos. 9,621,769; 9,596,387; 9,277,104; 9,077,098; 8,994,878; 8,542,451 and/or 7,965,336, and/or U.S. Publication Nos. US-2009-0244361; US-2013-0242099; US-2014-0373345; US-2015-0124098; US-2015-0222795; US-2015-0327398; US-2016-0243987; US-2016-0268716; US-2016-0286103; US-2016-0037028; US-2017-0054881; US-2017-0133811; US-2017-0201661; US-2017-0280034; US-2017-0295306; US-2017-0302829 and/or US-2018-0098033, and/or U.S. patent applications, Ser. No. 16/165,170, filed Oct. 19, 2018, now U.S. Pat. No. 10,750,064, and/or Ser. No. 16/165,253, filed Oct. 19, 2018, now U.S. Pat. No. 10,678,018, which are hereby incorporated herein by reference in their entireties.

The camera or sensor may comprise any suitable camera or sensor. Optionally, the camera may comprise a "smart camera" that includes the imaging sensor array and associated circuitry and image processing circuitry and electrical connectors and the like as part of a camera module, such as by utilizing aspects of the vision systems described in International Publication Nos. WO 2013/081984 and/or WO 2013/081985, which are hereby incorporated herein by reference in their entireties.

The system includes an image processor operable to process image data captured by the camera or cameras, such as for detecting objects or other vehicles or pedestrians or the like in the field of view of one or more of the cameras. For example, the image processor may comprise an image processing chip selected from the EYEQ™ family of image processing chips (for example, an EYEQ3·, EYEQ4™ or EYEQ5™ image processing chip) available from Mobileye Vision Technologies Ltd. of Jerusalem, Israel, and may include object detection software (such as the types described in U.S. Pat. Nos. 7,855,755; 7,720,580 and/or 7,038,577, which are hereby incorporated herein by reference in their entireties), and may analyze image data to detect vehicles and/or other objects. Responsive to such image processing, and when an object or other vehicle is detected, the system may generate an alert to the driver of the vehicle and/or may generate an overlay at the displayed image to highlight or enhance display of the detected object or vehicle, in order to enhance the driver's awareness of the detected object or vehicle or hazardous condition during a driving maneuver of the equipped vehicle.

For example, the vision system and/or processing and/or camera and/or circuitry may utilize aspects described in U.S. Pat. Nos. 9,233,641; 9,146,898; 9,174,574; 9,090,234; 9,077,098; 8,818,042; 8,886,401; 9,077,962; 9,068,390; 9,140,789; 9,092,986; 9,205,776; 8,917,169; 8,694,224; 7,005,974; 5,760,962; 5,877,897; 5,796,094; 5,949,331; 6,222,447; 6,302,545; 6,396,397; 6,498,620; 6,523,964; 6,611,202; 6,201,642; 6,690,268; 6,717,610; 6,757,109; 6,802,617; 6,806,452; 6,822,563; 6,891,563; 6,946,978; 7,859,565; 5,550,677; 5,670,935; 6,636,258; 7,145,519; 7,161,616; 7,230,640; 7,248,283; 7,295,229; 7,301,466; 7,592,928; 7,881,496; 7,720,580; 7,038,577; 6,882,287; 5,929,786 and/or 5,786,772, and/or U.S. Publication Nos. US-2014-0340510; US-2014-0313339; US-2014-0347486; US-2014-0320658; US-2014-0336876; US-2014-0307095; US-2014-0327774; US-2014-0327772; US-2014-0320636; US-2014-0293057; US-2014-0309884; US-2014-0226012; US-2014-0293042; US-2014-0218535; US-2014-0218535; US-2014-0247354; US-2014-0247355; US-2014-0247352; US-2014-0232869; US-2014-0211009; US-2014-0160276; US-2014-0168437; US-2014-0168415; US-2014-0160291; US-2014-0152825; US-2014-0139676; US-2014-0138140; US-2014-0104426; US-2014-0098229; US-2014-0085472; US-2014-0067206; US-2014-0049646; US-2014-0052340; US-2014-0025240; US-2014-0028852; US-2014-005907; US-2013-0314503; US-2013-0298866; US-2013-0222593; US-2013-0300869; US-2013-0278769; US-2013-0258077; US-2013-0258077; US-2013-0242099; US-2013-0215271; US-2013-0141578 and/or US-2013-0002873, which are all hereby incorporated herein by reference in their entireties. The system may communicate with other communication systems via any suitable means, such as by utilizing aspects of the systems described in International Publication Nos. WO 2010/144900; WO 2013/043661 and/or WO 2013/081985, and/or U.S. Pat. No. 9,126,525, which are hereby incorporated herein by reference in their entireties.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A vehicular camera module, said vehicular camera module comprising:

a lens barrel having a plurality of optical elements accommodated therein;

a front camera housing portion and a rear camera housing portion;

an imager printed circuit board disposed at said front camera housing portion, said imager printed circuit board having a first side and a second side separated by a thickness dimension of said imager printed circuit board;

an imager disposed at the first side of said imager printed circuit board;

a processor printed circuit board accommodated in said vehicular camera module;

an image processor disposed at said processor printed circuit board;

wherein, with said imager printed circuit board disposed at said front camera housing portion and said processor printed circuit board accommodated in said vehicular camera module, said processor printed circuit board is spaced from and electrically connected to circuitry of said imager printed circuit board;

a heat transfer element disposed at said rear camera housing portion and between and in thermal conductive contact with a rear wall of said rear camera housing portion and the second side of said imager printed circuit board;

wherein said heat transfer element extends through an aperture of said processor printed circuit board;

wherein said rear camera housing portion is mated with said front camera housing portion to form a camera housing that encases said imager printed circuit board, said processor printed circuit board and said heat transfer element;

wherein circuitry of said vehicular camera module is electrically connected to said imager and said image processor and is electrically connected to electrical connecting elements at said rear camera housing portion that are configured to electrically connect to a wire harness of a vehicle when said vehicular camera module is disposed at a vehicle;

wherein, with said electrical connecting elements electrically connected to the wire harness of the vehicle, heat generated by operation of said vehicular camera module is drawn from said imager printed circuit board to said rear camera housing portion via said heat transfer element; and wherein said heat transfer element is thermally conductively connected to a thermoelectric device at said rear camera housing portion.

2. The vehicular camera module of claim 1, wherein said vehicular camera module is configured to be disposed at an exterior portion of the vehicle so as to have a field of view exterior of the vehicle.

3. The vehicular camera module of claim 1, wherein said rear camera housing portion comprises a heat sink.

4. The vehicular camera module of claim 1, wherein said heat transfer element is attached at a rear structure at the rear wall of said rear camera housing portion and is held in thermal conductive contact with the rear wall of said rear camera housing portion via said rear structure of said rear camera housing portion.

5. The vehicular camera module of claim 4, wherein said heat transfer element is attached at said rear structure of said rear camera housing portion via a plurality of fasteners.

6. The vehicular camera module of claim 4, further comprising a desiccant sheet disposed between said rear camera housing portion and said rear structure.

7. The vehicular camera module of claim 6, comprising a heat spreading material disposed between said desiccant sheet and said rear structure of said rear camera housing portion.

8. The vehicular camera module of claim 1, comprising a thermal interface material disposed at the second side of said imager printed circuit board and between and in thermal conductive contact with the second side of said imager printed circuit board and said heat transfer element.

9. A vehicular camera module, said vehicular camera module comprising:

a lens barrel having a plurality of optical elements accommodated therein;

a front camera housing portion and a rear camera housing portion;

at least one printed circuit board accommodated in said vehicular camera module;

an imager disposed at a first side of said at least one printed circuit board;

an image processor disposed at said at least one printed circuit board;

a heat transfer element disposed at a rear structure of said rear camera housing portion;

wherein said rear camera housing portion is mated with said front camera housing portion to form a camera housing that encases said at least one printed circuit board and said heat transfer element;

wherein, with said rear camera housing portion mated with said front camera housing portion, said heat transfer element is in thermal conductive contact with a second side of said at least one printed circuit board;

a desiccant sheet disposed between said rear camera housing portion and said rear structure;

wherein circuitry of said vehicular camera module is electrically connected to said imager and said image processor and is electrically connected to electrical connecting elements at said rear camera housing portion that are configured to electrically connect to a wire harness of a vehicle when said vehicular camera module is disposed at the vehicle; and wherein, with said electrical connecting elements electrically connected to the wire harness of the vehicle, heat generated by operation of said vehicular camera module is drawn from said at least one printed circuit board to said rear camera housing portion via said heat transfer element and said desiccant sheet; and wherein said heat transfer element is thermally conductively connected to a thermoelectric device at said rear camera housing portion.

10. The vehicular camera module of claim 9, wherein said rear structure is attached at said rear camera housing portion, and wherein said desiccant sheet is disposed between said rear camera housing portion and said rear structure at least where said rear structure is attached at said rear camera housing portion.

11. The vehicular camera module of claim 9, comprising a heat spreading material disposed between said desiccant sheet and said rear structure of said rear camera housing portion.

12. The vehicular camera module of claim 9, wherein said heat transfer element is attached at said rear structure of said rear camera housing portion via a plurality of fasteners.

13. The vehicular camera module of claim 9, wherein said vehicular camera module is configured to be disposed at an exterior portion of the vehicle so as to have a field of view exterior of the vehicle.

14. The vehicular camera module of claim 9, wherein said rear camera housing portion comprises a heat sink.

15. A vehicular camera module, said vehicular camera module comprising:

a lens barrel having a plurality of optical elements accommodated therein;

a front camera housing portion and a rear camera housing portion;

an imager printed circuit board disposed at said front camera housing portion, said imager printed circuit board having a first side and a second side separated by a thickness dimension of said imager printed circuit board;

an imager disposed at the first side of said imager printed circuit board;

a processor printed circuit board accommodated in said vehicular camera module;

an image processor disposed at said processor printed circuit board;

wherein, with said imager printed circuit board disposed at said front camera housing portion and said processor printed circuit board accommodated in said vehicular camera module, said processor printed circuit board is spaced from and electrically connected to circuitry of said imager printed circuit board;

a heat transfer element attached at rear structure at a rear wall of said rear camera housing portion, wherein said heat transfer element is disposed between and in thermal conductive contact with the rear wall of said rear camera housing portion and the second side of said imager printed circuit board;

wherein said heat transfer element is held in thermal conductive contact with the rear wall of said rear camera housing portion via said rear structure at the rear wall of said rear camera housing portion;

wherein said heat transfer element extends through an aperture of said processor printed circuit board;

a thermal interface material disposed between and in thermal conductive contact with the second side of said imager printed circuit board and said heat transfer element;

wherein said rear camera housing portion is mated with said front camera housing portion to form a camera housing that encases said imager printed circuit board, said processor printed circuit board and said heat transfer element;

wherein circuitry of said vehicular camera module is electrically connected to said imager and said image processor and is electrically connected to electrical connecting elements at said rear camera housing portion that are configured to electrically connect to a wire harness of a vehicle when said vehicular camera module is disposed at a vehicle; and wherein, with said electrical connecting elements electrically connected to the wire harness of the vehicle, heat generated by operation of said vehicular camera module is drawn from said imager printed circuit board to said rear camera housing portion via said heat transfer element; and wherein said heat transfer element is thermally conductively connected to a thermoelectric device at said rear camera housing portion.

16. The vehicular camera module of claim 15, wherein said vehicular camera module is configured to be disposed at an exterior portion of the vehicle so as to have a field of view exterior of the vehicle.

17. The vehicular camera module of claim 15, wherein said rear camera housing portion comprises a heat sink.

18. The vehicular camera module of claim 15, wherein said heat transfer element is attached at said rear structure at the rear wall of said rear camera housing portion via a plurality of fasteners.

19. The vehicular camera module of claim 15, further comprising a desiccant sheet disposed between said rear camera housing portion and said rear structure.

20. The vehicular camera module of claim 19, comprising a heat spreading material disposed between said desiccant sheet and said rear structure at the rear wall of said rear camera housing portion.

* * * * *